US007809037B2

(12) United States Patent
Hoashi et al.

(10) Patent No.: US 7,809,037 B2
(45) Date of Patent: Oct. 5, 2010

(54) LASER ARRAY CIRCUIT

(75) Inventors: Yoshiaki Hoashi, Kariya (JP); Hiroyuki Tarumi, Nisshin (JP)

(73) Assignee: DENSO CORPORATION, Kariya (JP)

( * ) Notice: Subject to any disclaimer, the term of this patent is extended or adjusted under 35 U.S.C. 154(b) by 12 days.

(21) Appl. No.: 12/314,927

(22) Filed: Dec. 18, 2008

(65) Prior Publication Data

US 2009/0161710 A1 Jun. 25, 2009

(30) Foreign Application Priority Data

Dec. 20, 2007 (JP) ............................. 2007-328875
Sep. 22, 2008 (JP) ............................. 2008-242560

(51) Int. Cl.
*H01S 3/00* (2006.01)

(52) U.S. Cl. ............... 372/38.02; 372/38.07; 372/50.12

(58) Field of Classification Search ............... 372/38.02
See application file for complete search history.

(56) References Cited

U.S. PATENT DOCUMENTS

| 5,191,589 | A | 3/1993 | Amano et al. | |
| 6,771,679 | B2 * | 8/2004 | Schie | 372/38.1 |
| 6,798,797 | B2 * | 9/2004 | Mangano et al. | 372/29.01 |

FOREIGN PATENT DOCUMENTS

| EP | 0665446 A2 | 11/1994 |
| JP | U-62-034454 | 2/1987 |
| JP | A-1-152683 | 6/1989 |
| JP | A-2001-053223 | 2/2001 |

OTHER PUBLICATIONS

Office Action mailed Dec. 1, 2009 from the Japan Patent Office for corresponding patent application No. 2008-242560 (English translation enclosed).

* cited by examiner

*Primary Examiner*—Armando Rodriguez
*Assistant Examiner*—Xnning Niu
(74) *Attorney, Agent, or Firm*—Posz Law Group, PLC

(57) ABSTRACT

A laser array circuit decreases the size of a circuit pattern. A laser-diode (LD) driving switching element with a low on resistance is used in common with and switches conduction and non-conduction of a large current to each of a plurality of charge capacitors and charge switching elements that accumulate charge in the charge capacitors in respective drive circuits. An LD array and the LD driving switching element are closely located on a light-emitting board. By laying out the LD array and charge capacitors considering only the positional relationship therebetween, the size of a circuit pattern including LDs and the charge capacitors can be decreased.

20 Claims, 8 Drawing Sheets

LASER ARRAY CIRCUIT

CROSS-REFERENCE TO RELATED APPLICATIONS

The present application is based on and claims priority to Japanese Application No. 2007-328875, filed Dec. 20, 2007 and 2008-242560 filed Sep. 22, 2008, the entire contents of both of which are incorporated herein by reference.

BACKGROUND OF THE INVENTION

1. Field of the Invention

The present invention relates to a drive circuit and more particularly to a laser array circuit in which charges are sequentially accumulated in a charge capacitor associated with a laser diode array scheduled to emit light by repeatedly switching a laser diode driving element on and off in order to cause multiple laser diodes to sequentially emit light so as to generate pulsed light.

2. Description of the Related Art

A conventional semiconductor laser beam scanner is proposed, for example, in JP-A-1-152683. Specifically therein, a semiconductor laser beam scanner is described including a semiconductor laser array having multiple laser diodes in alignment, and a convex lens disposed in a laser-beam emitting direction of the semiconductor laser array.

The semiconductor laser beam scanner adopts an electronic scanning method that includes deflecting a laser beam at an angle determined based on the position of a light-emitting point of the semiconductor laser array and the focal length of the convex lens. The laser diodes are sequentially lit by drive circuits, which are individually connected to the respective laser diodes, while having a time difference created by the drive circuits. Since a range that can be scanned by the laser diodes is determined when a laser beam is sequentially emitted from the semiconductor laser array in a direction that begins with one end of the semiconductor laser array, an entity located in front of the semiconductor laser beam scanner is scanned.

In general, for a drive circuit that drives a sole laser diode, a method can be adopted involving applying a steeply pulsating current to a laser diode on the basis of charge accumulated in a capacitor by turning on a switching element such as a MOSFET. In such a method, a current of several tens of amperes must be applied to each of the laser diodes for a period of several tens of nanoseconds in order to produce the required pulsed light. Therefore, a MOSFET having the ability to switch conduction of a large current and non-conduction thereof at a high speed with a low on resistance must be selected. A chip size associated with the MOSFET having such an ability is large, on the order of, for example, 3 mm by 3 mm. A circuit pattern having interconnected laser diodes, capacitors, and MOSFETs must be wired with thick and short connections.

However, the adoption of the MOSFET of the foregoing size makes it hard to minimize the size of the circuit pattern. Referring to FIG. 10, a description will be made of a reason why the adoption makes the minimization hard.

FIG. 10 shows a layout of a semiconductor laser array 30, MOSFETs 31, chip capacitors 32 on a circuit board 33. The chip capacitors 32 and MOSFETs 31 are laid out on the circuit board 32 in association with laser diodes in order to individually drive the laser diodes so as to sweep a laser beam.

In such a case, the chip capacitors 32 and MOSFETs 31 are laid out with the lengths of wirings equalized so that the wiring impedances each including a parasitic resistance and a parasitic inductance produced on each of the wirings laid to link the laser diodes and chip capacitors 32 will square with one another. However, as shown in FIG. 10, when the MOSFETs 31 of the foregoing size are arrayed on the circuit board 33, the number of MOSFETs 31 that can be disposed on the circuit board 33 is limited. Eventually, the number of laser diodes is limited. Therefore, a wide range cannot be scanned with a high degree of precision.

Increasing the number of laser diodes requires a corresponding increase in the number of MOSFETs 31, leading to a disadvantageous increase in the size of the circuit board 33. As the circuit pattern gets larger, the wiring impedance including parasitic resistance and parasitic inductance gets larger and may give rise to propagation conditions where a pulse width may be expanded, a pulse may be split into multiple parts, or a pulse may be lost. Further, the waveform of a pulse may be destroyed, or a crest value may be decreased and it becomes difficult or impossible to feed the driving circuits with a steeply pulsating current.

SUMMARY OF THE INVENTION

The foregoing and other disadvantages are addressed by providing a laser array circuit that makes it possible to decrease the size of a circuit pattern.

In order to address the disadvantages, a laser diode array is provided that includes multiple laser diodes that emit light, charge capacitors that accumulate a charge, charge switching elements that facilitate the accumulation of charge in the charge capacitors, and a laser diode driving switching element that causes a current equivalent to the charge accumulated in the charge capacitor to flow into the laser diode. The numbers of charge capacitors and charge switching elements are identical to the number of laser diodes. The laser diode, charge capacitor, and charge switching element constitute a drive circuit. The laser diode driving switching element to control the multiple laser diodes. Charge is sequentially accumulated in turn in the charge capacitor associated with the laser diode scheduled to emit light. The laser diode driving switching element, which is connected in common to the multiple laser diodes, is repeatedly turned on or off in order to sequentially cause the multiple laser diodes to generate pulsed light.

Since the laser diode driving switching element is used in common to drive the laser diodes, individual laser diode driving switching elements associated with the laser diodes are not required. Therefore, since only the positional relationship among the laser diode array and the multiple charge capacitors should be taken into consideration, the size of a circuit pattern including the multiple laser diodes and multiple charge capacitors can be decreased.

Since the size of the circuit pattern can be decreased, wiring impedances can be reduced. Steeply pulsed light can be generated from the laser diodes.

Multiple units each having the laser diode driving switching element used in common among multiple laser diodes may also be included.

A means can be provided that manages whether charge is accumulated in the charge capacitor based on the time during which the charge switching element remains on.

The above described means allows sufficient charge to be accumulated in the charge capacitor associated with the laser diode scheduled to emit light.

A tabular light-emitting board is further included. The laser diode array and multiple charge capacitors are disposed on the light-emitting board so that the lengths of wirings linking the multiple laser diodes included in the laser diode array and the multiple charge capacitors associated with the multiple laser diodes will be equal to one another.

As a result, the wiring impedances, each including a parasitic resistance and a parasitic inductance, produced between each of the laser diodes and each of the charge capacitors are also equal with one another and pulsed light whose waveform and intensity are uniform can be emitted from the laser diodes.

The light-emitting board has one side and an other side. The laser diode array and charge capacitors are disposed on the one side of the light-emitting board, and the laser diode driving switching element is disposed on the other side of the light-emitting board. The laser diode array and laser diode driving switching element overlap in a direction perpendicular to the one side of the light-emitting board.

Since the laser diode array and laser diode driving switching elements can be located close to each other, the wiring impedances produced among the laser diodes included in the laser diode array and the laser diode driving switching element can be reduced and made equal.

The multiple charge capacitors are disposed in arcuate relation with a center at an intermediate point interposed between the center point of the laser diode array and the center point of the laser diode driving switching element.

The charge capacitors can therefore be laid out while being connected by the shortest wiring length to the respective laser diodes or the laser diode driving switching element.

In accordance with various embodiments, the same number of backflow prevention elements as the number of laser diodes can be included. A drive circuit includes the laser diode, a charge capacitor, a charge switching element, and the backflow prevention element. A first loop circuit including the charge capacitor, backflow prevention element, and laser diode is formed in relation to each of the multiple laser diodes so that a current equivalent to charge accumulated in the charge capacitor will flow from the charge capacitor to the laser diode. The first and a second loop circuit different from the first loop circuit are connected onto a common wiring to be thus electrically interconnected, and connected to the laser diode driving switching element over the common wiring. The backflow prevention element is connected to the laser diode in order to block a current that attempts to flow from the second loop circuit into the charge capacitor over the common wiring.

While the charge capacitor associated with the laser diode scheduled to emit light is being charged, a reverse voltage is applied to the laser diodes that are not scheduled to emit light since the loop circuits are electrically interconnected over the common wiring. Therefore, a leakage current attempts to flow into the laser diodes. However, in each of the loop circuits including the laser diodes not scheduled to emit light, the backflow prevention element blocks the leakage current that attempts to flow from the laser diode into the charge capacitor. Therefore, the charge capacitors associated with the laser diodes not scheduled to emit light can be prevented from being charged with the respective leakage currents.

The laser diodes not scheduled to emit light can be prevented from emitting light. Since a voltage exceeding the dielectric strength against a reverse voltage of the laser diode scheduled to emit light can be applied to the laser diode scheduled to emit light, an amount of charge to be accumulated in the charge capacitor will not be restricted. Therefore, the limit in the intensity of light emitted from the laser diode can be eliminated. Further, a charging time may not be shortened in order to prevent the capacitors included in the loop circuits not scheduled to emit light, from being charged with the respective leakage currents.

In various embodiments, a tabular light-emitting board is included. The laser diode array including the multiple laser diodes, the multiple charge capacitors, the multiple backflow prevention elements, and the laser diode driving switching element are disposed on the light-emitting board so that the lengths of the wirings of the loop circuits will square with one another.

The wiring impedances each including a parasitic resistance and a parasitic inductance produced in each of the loop circuits can be squared with one another. Therefore, pulsed light whose waveform and intensity are uniform can be emitted from the laser diodes included in the respective loop circuits.

The light-emitting board has one side and an other side. The laser diode array is disposed on the one side of the light-emitting board, and the laser diode driving switching element is disposed on the other side of the light-emitting board. The laser diode array and laser diode driving switching element overlap in a direction perpendicular to the one side of the light-emitting board.

The laser diode array and laser diode driving switching element can be located mutually closely. That is, the wiring impedances produced among the laser diodes included in the laser diode array and the laser diode driving switching element can be reduced and made equal with one another.

The multiple charge capacitors are disposed on the other side of the light-emitting board. More particularly, the multiple charge capacitors are disposed on the other side of the light-emitting board in arcuate relation with an arc center at an intermediate point interposed between the center point of the laser diode array and the center point of the laser diode driving switching element. The multiple backflow prevention elements are disposed on the one side of the light-emitting board. More particularly, the backflow prevention elements are disposed on the one side of the light-emitting board in arcuate relation with an arc center at the intermediate point interposed between the center point of the laser diode array and the center point of the laser diode driving switching element.

The multiple charge capacitors and multiple backflow prevention elements can be laid out while being connected by the shortest wiring length to the laser diode driving switching element. Therefore, a parasitic resistance and a parasitic inductance produced in each of the loop circuits can be reduced. Thus, light of a large power and a short pulse width can be emitted.

The backflow prevention elements are located on the side of the light-emitting board opposite to the side thereof on which the charge capacitors are located. Based on such an arrangement, the lengths of the wirings of the loop circuits can be decreased.

The backflow prevention elements may be diodes.

The backflow prevention elements may be laser diodes.

Multiple laser diodes serving as the backflow prevention element are interconnected in multiple layers.

When the laser diode emits light, the laser diode serving as the backflow prevention element also emits light. An amount of light emitted from the loop circuit including the laser diodes therefore increases.

MOSFETs may be adopted as the multiple charge switching elements and laser diode driving switching element.

The multiple charge switching elements are elements featuring a lower switching speed, a smaller current capacity, a larger on resistance, and a smaller size than the laser diode driving switching element.

As mentioned above, switching elements that are poorer in performance and smaller in size than the laser diode driving switching element can be adopted as the charge capacitors. The multiple charge switching elements can therefore be incorporated in one chip.

The multiple charge switching elements may be incorporated in a logic IC that realizes one facility.

The multiple charge switching elements may be incorporated in a sequencer that includes multiple logic ICs each of which realizes one facility.

The numerals written in parentheses adjacently to the pieces of means indicate the relationships of correspondence with pieces of exemplary means described in relation to embodiments later.

BRIEF DESCRIPTION OF THE DRAWINGS

Other objects, features and characteristics of the present invention will be appreciated and become apparent to those of ordinary skill in the art and all of which form a part of the present application. In the drawings.

DETAILED DESCRIPTION OF THE EXEMPLARY EMBODIMENTS

First Embodiment

Figure 1:
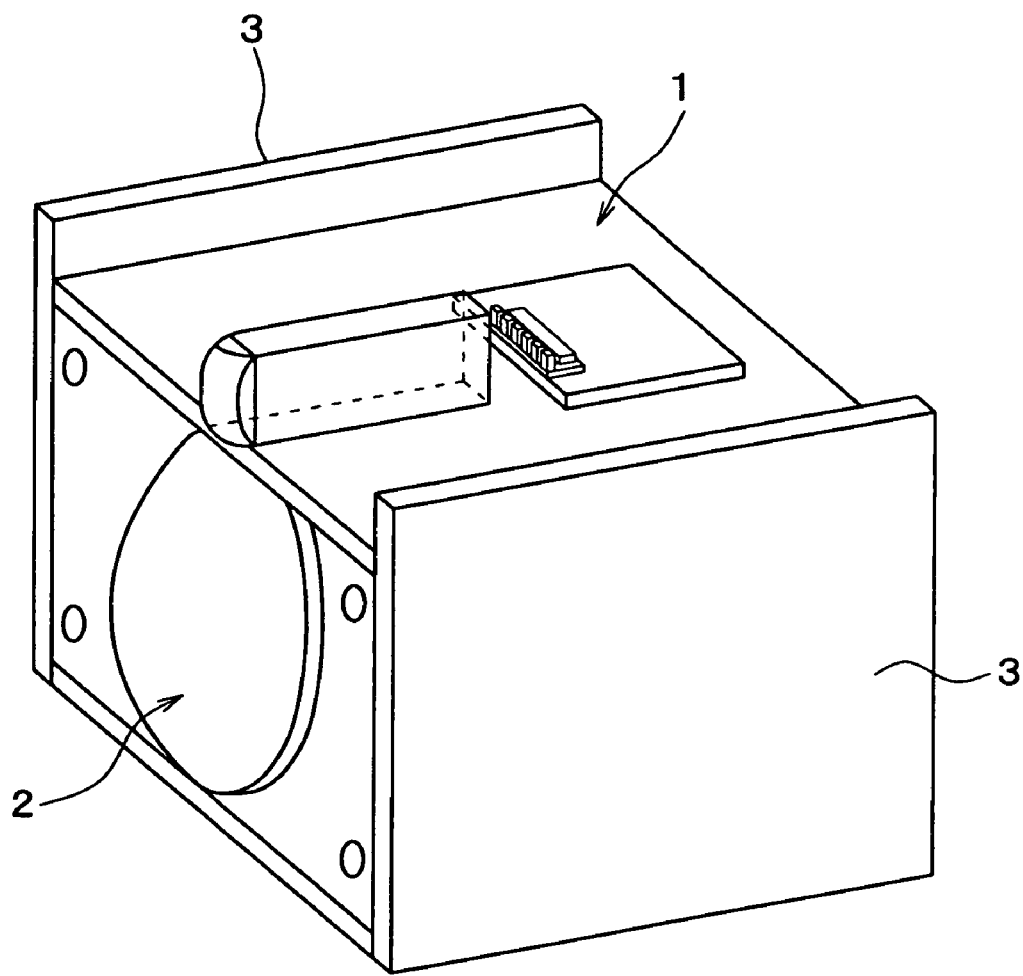
FIG. 1 is a diagram illustrating a perspective view of the internal constitution of a distance detection device to which a first embodiment is adapted.

Referring to the drawings, a first embodiment will be described below. In the present embodiment, a description will be made of a case where a laser array circuit is adapted to a distance detection device. The distance detection device is mounted in, for example, a vehicle, and used as an onboard laser radar that detects a preceding vehicle run in front of the vehicle.

FIG. 1 is a perspective view of the internal constitution of the distance detection device to which a first embodiment is adapted. As shown in the drawing, the distance detection device includes a light-emitting module 1 that emits light and a light-receiving module 2 that receives light, including light reflected from an entity located in front of the vehicle.

The light-emitting module 1 is disposed on the light-receiving module 2, and the flanks of the light-emitting module 1 and light-receiving module 2 are interposed between two circuit boards 3 in which circuit patterns that are not shown are formed. The internal structure is stored in a casing (not shown), in which the distance detection device is made.

Figure 2A:
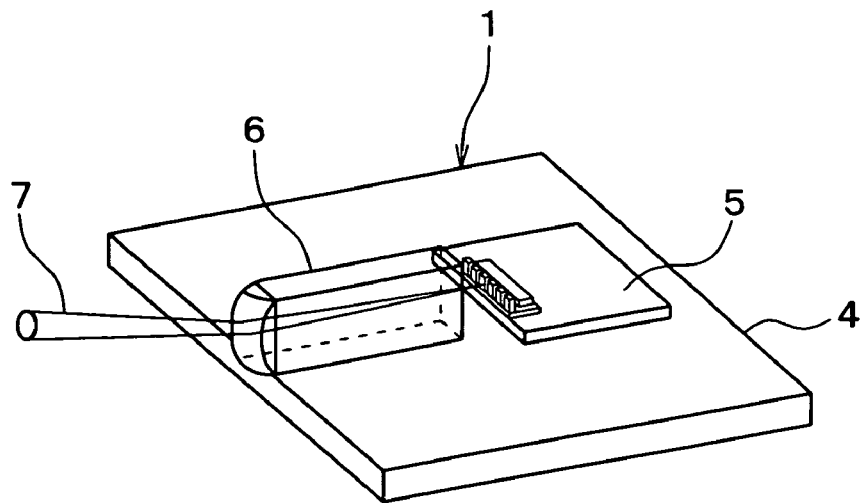
FIG. 2A is a diagram illustrating a perspective view of a light-emitting module.
Figure 2B:
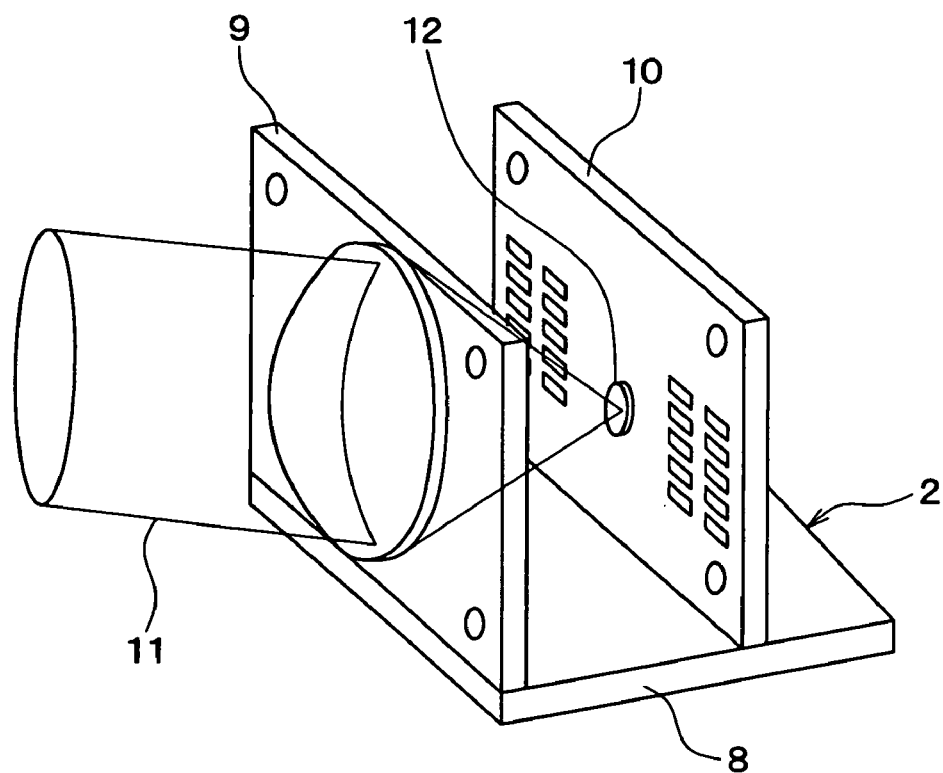
FIG. 2B is a diagram illustrating a perspective view of a light-receiving module.

FIG. 2A and FIG. 2B are exploded perspective views showing the light-emitting module 1 and light-receiving module 2 disassembled and shown in FIG. 1. FIG. 2A is the perspective view of the light-emitting module 1, and FIG. 2B is the perspective view of the light-receiving module 2.

As shown in FIG. 2A, the light-emitting module 1 includes a plate member 4, a tabular light-emitting board 5, and a lens 6. The light-emitting board 5 emits pulsed light 7 from multiple laser diodes (LD) 17 as shown and described hereinafter in connection with FIG. 4, and is formed with a both-sided ceramic substrate. The lens 6 is a collimating resin lens or a toroidal lens that introduces the pulsed light 7 emitted from the light-emitting board 5, into an entity located in front of the vehicle. An end surface of the parallelepiped lens 6 opposite to the other end surface thereof is formed as a curved surface. The curved surface of the lens 6 is oriented to the outer edge side of the plate member 4. The lens 6 and light-emitting board 5 are aligned with each other on one side of the plate member 4.

As shown in FIG. 2B, the light-receiving module 2 includes a plate member 8, a light-receiving lens 9, and a light-receiving board 10. The light-receiving lens 9 is tabular and is formed to have a lens portion, of which surface is curved, in the center thereof. The light-receiving board 10 receives reflected light 11, and has a light-receiving element 12 and a circuit disposed at the focal position of the reflected light 11 concentrated by the light-receiving lens 9. As the light-receiving element 12, a light-receiving diode may be adopted. The light-receiving lens 9 is fixed perpendicularly to an edge of one side of the plate member 8, and the light-receiving board 10 is fixed to the one side of the plate member 8 in parallel with the light-receiving lens 9.

Figure 3A:
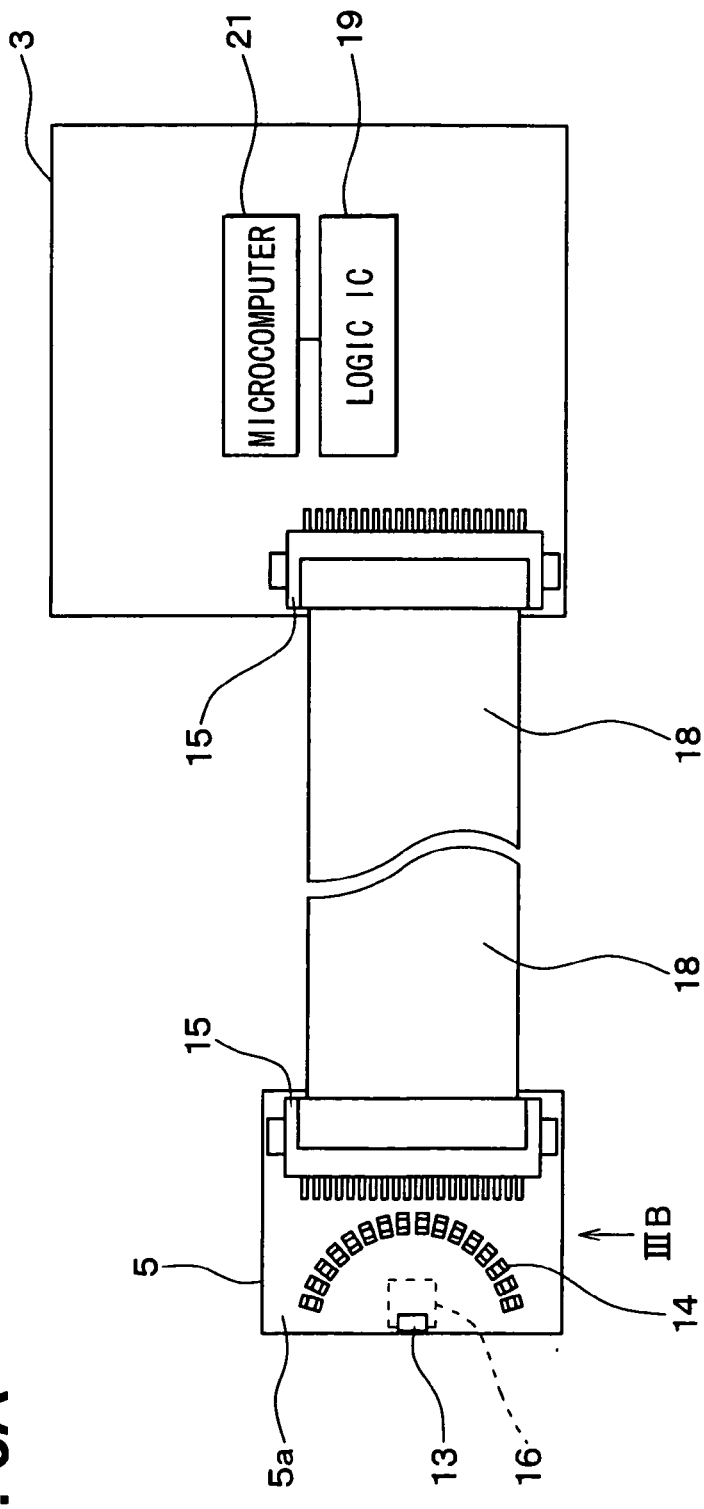
FIG. 3A is a diagram illustrating a plan view of a light-emitting board and a circuit board electrically connected to the light-emitting board.
Figure 3B:
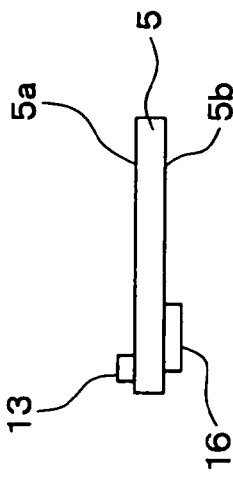
FIG. 3B is a diagram illustrating an arrow-A view of the light emitting board shown in FIG. 3A.

A description will be made of the light-emitting board 5 included in the distance detection device having the foregoing internal structure. FIG. 3A is a schematic plan view of the light-emitting board 5 and the circuit board 3 electrically connected to the light-emitting board 5. FIG. 3B is an arrow-A view of the light-emitting board 5 shown in FIG. 3A. In FIG. 3B, charge capacitors 14 and a connector 15 are not shown.

As shown in FIG. 3A, an LD array 13, the charge capacitors 14 in which charge is accumulated, and the connector 15 are disposed on one side 5a of the light-emitting board 5. As shown in FIG. 3B, an LD driving switching element 16 is disposed on the other side 5b of the light-emitting board 5.

The LD array 13 includes multiple LDs 17 that emit pulsed light 7. In the present embodiment, the LD array 13 has sixteen LDs that are aligned in the same direction. Like the distance detection device shown in FIG. 1, an onboard laser radar or the like is requested to offer a fine azimuthal resolution so that the condition in a sense area such as the condition of a preceding vehicle can be accurately determined. The LD array 13, when used to electronically scan an entity located in front of the vehicle, desirably includes numerous LDs. In the present embodiment, the number of LDs 17 is sixteen. However, the number of LDs 17 is not limited to sixteen but may be another numerical value. The LD array 13 is disposed on the outer edge of the light-emitting board 5 on the one side 5a thereof.

The LD array 13 has the sixteen LDs 17 fabricated in one semiconductor chip through a semiconductor process. A micro-prism through which light is emitted as a beam is disposed in a light emitting part of each of the LDs 17. The micro-prisms are disposed at different emission angles so that pulsed light 7 will be irradiated from the LDs 7 at a specific angle and the beam will be irradiated in one direction in front of the distance detection device.

The same number of charge capacitors 14 as the number of LDs 17 is disposed on the light-emitting board 5, and the charge capacitors 14 are connected to the respective LDs 17. The charge capacitors 14 are disposed on the light-emitting board 5 so that the lengths of the wirings (not shown) that link the LDs 17 included in the LD array 13 and the charge capacitors 14 associated with the LDs 17 will be equal to one another.

As shown in FIG. 3B, the LD driving switching element 16 is disposed on the other side 5b of the light-emitting board 5. The LD driving switching element 16 feeds a current equivalent to the charge accumulated in each of the charge capacitors 14, to each of the LDs 17, and is used in common among the LDs 17. Namely, the LDs 17 are connected to the LD driving switching element 16.

Supposing the light-emitting board 5 is seen in a direction perpendicular to the one side 5a of the light-emitting board 5, the LD array 13 and LD driving switching element 16 overlap. Specifically, the LD array 13 is disposed on the one side 5a of the light-emitting board 5 and the LD driving switching element 16 is disposed on the other side 5b of the light-emitting board 5, so that if the one side 5a of the light-emitting board is seen, at least the contours of the LD array 13 and LD driving switching element 16 will overlap.

In the above described positional relationships, the LD array 13 and LD driving switching element 16 are closely located. The wiring impedances among the LDs 17 and the LD driving switching element 16 can be reduced and are made to be equal with one another.

In the present embodiment, the charge capacitors 14 are disposed in an arc, that is, in arcuate relation, with the center point of the LD array 13 as a center of the arc. Alternatively, the charge capacitors 14 may be disposed in an arc with the center point of the LD driving switching element 16 as a center of the arc.

A wiring member, which can be referred to by a term such as a ribbon cable or a flat wire 18 is coupled to the connector 15. As shown in FIG. 3A, another connector 15 is formed on the circuit board 3. The light-emitting board 5 and circuit board 3 are electrically connected to each other over the flat wire 18.

On the circuit board 3, a logic IC 19 that realizes one facility is mounted, and other electric circuits and discrete parts (not shown) are mounted. The logic IC 19 is electrically connected to the other parts and connector 15 over a wiring (not shown).

Charge switching elements 20, which are shown and described in greater detail hereinafter in connection with FIG. 4, accumulate charge in the charge capacitors 14 and are incorporated in the logic IC 19. The same number of charge switching elements 20 as the number of LDs 17 is incorporated in the logic IC 19. In the present embodiment, the logic IC 19 is a single-facility IC having the charge switching elements 20 alone incorporated therein.

The charge switching elements 20 feature a lower switching speed, a smaller current capacity, a larger on-resistance, and a smaller size than the LD driving switching element 16 does. Therefore, all the charge switching elements 20 can be built in the logic IC 19.

In the present embodiment, p-channel MOSFETs are adopted as the charge switching elements 20, and an n-channel MOSFET is adopted as the LD driving switching element 16.

A microcomputer 21 is also mounted on the circuit board 3. The microcomputer 21 includes a facility that produces a trigger signal, with which the LD driving switching element 16 is turned on or off, at the time at which the LD 17 should emit light and a facility or means that manages whether charge is accumulated in the charge capacitor 14 based on the time during which the charge switching element 20 remains on.

The trigger signal produced by the microcomputer 21 is inputted to the LD driving switching element 16, which is attached to the light-emitting board 5, over the flat wire 18. The microcomputer 21 detects the time during which the charge switching element 20 remains on, and uses the time to control the on or off states of the charge switching elements 20. During the time during which the charge switching element 20 remains on, sufficient charge is accumulated in the charge capacitor 14.

Figure 4:
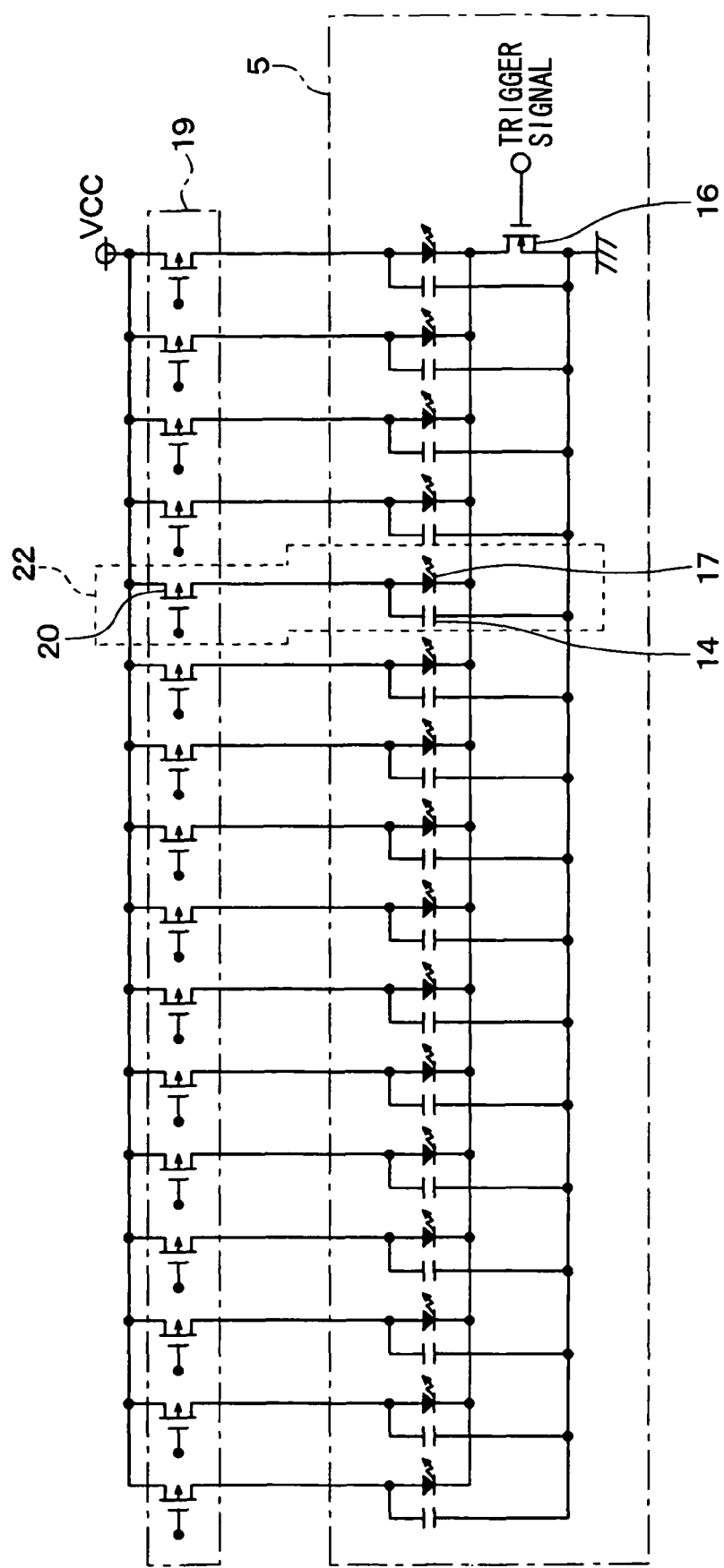
FIG. 4 shows an equivalent circuit of the light-emitting board and a logic IC shown in FIG. 3A.

FIG. 4 shows an equivalent circuit of the light-emitting board 5 and logic IC 19 which are shown in FIG. 3A. As shown in the drawing, the drains of the charge switching elements 20 are set to a certain potential VCC, and the anodes of the LDs 17 and the charge capacitors 14 are connected to the sources of the charge switching elements 20. The LD 17, charge capacitor 14, and charge switching element 20 constitute a drive circuit 22.

In the present embodiment, since the sixteen LDs 17 are lined in the LD array 13, the circuit configuration has sixteen drive circuits 22 connected in parallel with one another. Each of the drive circuits 22 is named, for example, a drive circuit on a channel ch1. The sixteen drive circuits 22 are called drive circuits on channels ch1 to ch16.

In the respective drive circuits 22, the cathodes of the LDs 17 are connected to the drain of the LD driving switching element 16, and the charge capacitors 14 are connected to the source of the LD driving switching element 16. The source of the LD driving switching element 16 is grounded.

A gate signal with which the charge switching element 20 is turned on or off is inputted from the microcomputer 21 to the gate of the charge switching element 20. The trigger signal produced by the microcomputer 21 is inputted to the gate of the LD driving switching element 16 via a driver (not shown).

In the foregoing circuitry, since the LD driving switching element 16 is used in common among the LDs 17, when the LD driving switching element 16 is turned on, a loop circuit is including the LD 17 and charge capacitor 14, which are included in each of the drive circuits 22, and the common LD driving switching element 16.

Before the loop circuit is constructed, when the charge switching element 20 is turned on, charge is accumulated in the charge capacitor 14. Therefore, when the loop circuit is constructed, a current equivalent to the charge accumulated in the charge capacitor 14 flows through the loop circuit. A current of, for example, 30 A flows through the loop circuit. Pulsed light 7 proportional to the current flowing through the loop circuit is emitted from the LD 17. The half width of the pulsed light 7 ranges, for example, from 27 ns to 30 ns.

In other words, charge is sequentially accumulated in the charge capacitor 14 associated with the LD 17 scheduled to emit light, and the LD driving switching element 16 is repeatedly turned on or off in order to sequentially allow the LDs 17 among which the LD driving switching element 16 is used in common to emit light.

In the foregoing loop circuit, a current of several tens of amperes must be applied to the LD 17 during several tens of nanoseconds. Therefore, the LD 17, charge capacitor 14, and LD driving switching element 16 have to be interconnected as closely as possible in a compact manner, and a resistance and an inductance accompanying the loop circuit have to be minimized. If the resistance and inductance are large, the LD 17 is hindered from emitting light of a large power and a short pulse width. Therefore, the wirings including the LDs 17 are laid out to have the same length and thickness to suppress a variance in properties.

In the present embodiment, the LD array 13 and LD driving switching element 16 are disposed at the same position on the light-emitting board 5 on the one side 5a of the light-emitting board 5 and the other side 5b thereof respectively. The charge capacitors 14 are disposed radially with the LD array 13 as a center, so that the loop circuits will include an wiring having an equal length.

Specifically, since the LD driving switching element 16 is used in common, it is sufficient that the positional relationships among the LD array 13 and charge capacitors 14 should be taken into consideration in order to minimize the wiring impedances of the loop circuits each including a parasitic resistance and a parasitic inductance. Therefore, once the position of the LD array 13 is determined, the charge capacitances 14 can be laid out so that the wiring impedances of the respective loop circuits will be minimized.

In the present embodiment, sixteen charge capacitors 14 are employed. As shown in FIG. 3A and FIG. 3B, the charge capacitors 14 are disposed in the form of an arc. Since the distances between the respective LDs 17 and the respective charge capacitors 14 can be made equal with one another, a circuit pattern can be formed so that the wirings included in the respective loop circuits will share the same length and thickness.

The wiring in the respective loop circuits are laid out so as to share the same length and thickness for the following reason. If the wiring impedances of the respective loop circuits are different from one another, the resulting pulsed light 7 will have a waveform and intensity variation from one of the LDs 17 to another. If the waveform of the pulsed light 7, emitted from the LDs 17, varies from individual LD to another and is emitted to an entity located in front of the vehicle, the entity cannot be highly precisely sensed because the entity cannot be uniformly scanned.

The LD driving switching element 16 to be used in common is disposed on the side of the light-emitting board 5 opposite to the side thereof on which the LD array 13 is disposed. The lengths of the wirings that are laid from the charge capacitors 14 to the LD driving switching element 16 can be squared with one another.

As mentioned above, even when sixteen of the charge capacitors 14 are employed, it is sufficient that a circuit pattern can be formed by taking account of only the dispositional relationships among the LD array 13 and charge capacitors 14 since the LD driving switching element 16 is used in common. Therefore, the size of the circuit pattern can be decreased.

Figure 5:
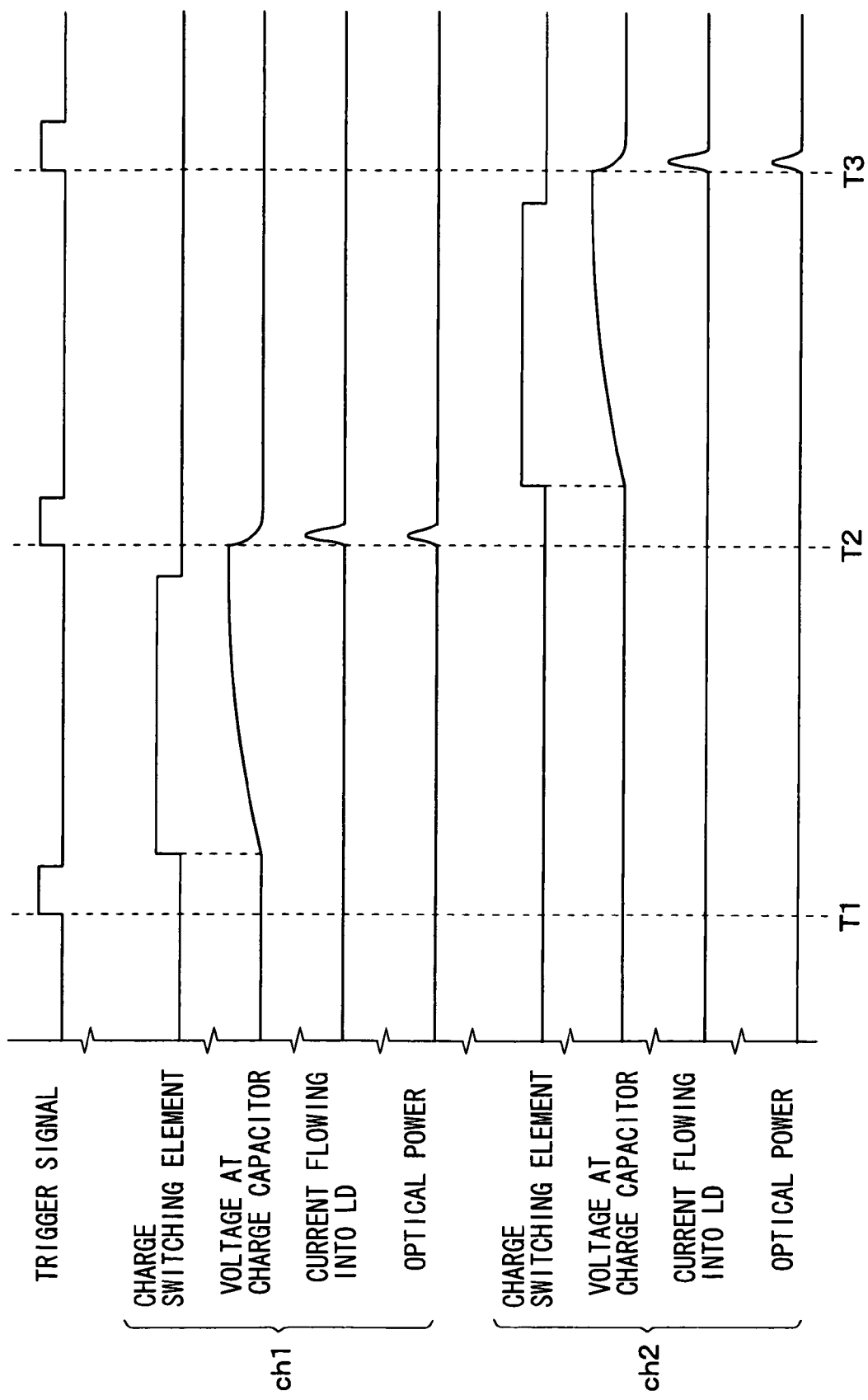
FIG. 5 is a diagram illustrating a timing chart concerning the circuit shown in FIG. 4.

Next, an entity detecting operation to be performed by the distance detection device will be described with reference to FIG. 4 and FIG. 5. FIG. 5 is a timing chart concerning the circuit shown in FIG. 4.

To begin with, a trigger signal produced by the microcomputer 21 is inputted to the LD driving switching element 16 via the driver (not shown) at a time T1 shown in FIG. 5. The LD driving switching element 16 is thereby turned on. The loop circuits are formed in the respective drive circuits 22. At time T1, no current flows through the loop circuits since no charge is accumulated in the charge capacitors 14 included in the respective drive circuits 22.

Thereafter, the microcomputer 21 causes the charge switching element 20, included in the drive circuit 22 on the channel ch1, to remain on during a certain period. Since charge is accumulated in the charge capacitor 14 included in the drive circuit 22 on the channel ch1, the voltage at the charge capacitor 14 rises. Charging the charge capacitor 14 is achieved using a current of, for example, several tens to several hundreds of milliamperes during the time of several tens to several hundreds of microseconds.

After the certain period elapses, the charge switching element 20 is turned off by the microcomputer 21. During the period during which the charge switching element 20 remains on, the charge capacitor 14 is fully charged. In such a case, the charge capacitor 14 included in the drive circuit 22 on the channel ch1 alone out of the sixteen drive circuits 22 is charged.

Thereafter, the trigger signal is inputted to the LD driving switching element 16 at a time instant T2. A current equivalent to the charge accumulated in the charge capacitor 14 included in the drive circuit 22 on the channel ch1 flows through the loop circuit alone in the drive circuit 22 on the channel ch1 during several nanoseconds to several tens of nanoseconds. Namely, a pulsating current flows as shown in FIG. 5. Accordingly, pulsed light 7 proportional to the pulsating current flowing through the loop circuit is emitted from the LD 17 included in the drive circuit 22 on the channel ch1. The pulsed light 7 emitted from the LD 17 is, as shown in FIG. 2A, passed through the lens 6 and irradiated from the curved surface of the lens 6.

Thereafter, after the time instant T2, when the LD driving switching element 16 is turned off, the microcomputer 21 causes the charge switching element 20 included in the drive circuit 22 on the channel ch2 to remain on during a certain period. Charge is accumulated in the charge capacitor 14. The charge switching element 20 included in the drive circuit 22 on the channel ch2 is then turned off.

When the trigger signal is inputted to the LD driving switching element 16 at a time instant T3, a current equivalent to the charge accumulated in the charge capacitor 14 included in the drive circuit 22 on the channel ch2 flows through the loop circuit alone in the drive circuit 22 on the channel ch2. Accordingly, pulsed light 7 is emitted from the LD 17 included in the drive circuit 22 on the channel ch2, and irradiated through the lens 6.

FIG. 5 shows only the timings concerning the drive circuits 22 on the channels ch1 and ch2. Likewise, the charge capacitors 14 included in the drive circuits 22 on the channels ch3 to ch16 are sequentially charged, and light is sequentially irradiated from the LDs 17 included in the drive circuits. Since the LDs 17 included in the respective drive circuits 22 on the channels ch1 to ch16 are sequentially allowed to emit light, an entity is scanned unidirectionally.

The lined LDs 17 sequentially emit pulsed light 7 in an order beginning from the LD on one end, and an entity located in front of the vehicle is consequently scanned. However, since the on and off states of the charge switching elements 20 included in the respective drive circuits 22 can be freely controlled by the microcomputer 21, it is possible that the lined LDs 17 sequentially emit the pulsed light 7 in arbitrary order other than in order from the LD on one end.

Specifically, reference to the lined LDs 17 sequentially emitting pulsed light means that the lined LDs 17 sequentially emit the pulsed light in an order beginning from the LD on one end or that the lined LDs 17 sequentially emit the pulsed light in arbitrary order. According to the concept of "sequentially," charge is sequentially accumulated in the charge capacitor 14 associated with the LD 17 scheduled to emit light, and the LD driving switching element 16 is repeatedly turned on or off in order to sequentially allow the LDs 17, among which the LD driving switching element 16 is used in common, to emit light. Charging the charge capacitor and turning on or off of the LD driving switching element are repeated the same number of times as the number of channels, which in the present example is sixteen. Unidirectional scanning is thereby achieved.

Incidentally, when reference is made to the LD 17 being scheduled to emit light, the meaning is that the LD 17 is scheduled to emit light when the LD driving switching element 16 is turned on next. It should be noted that the LD scheduled to emit light does not encompass all the LDs 17 that have not yet emitted light.

As mentioned above, when the pulsed light 7 is sequentially irradiated from the LDs 17, the pulsed light 7 is reflected from a position at which an entity exists. Reflected light 11 is, as shown in FIG. 2B, received by the light-receiving board 10. Since the microcomputer 21 manages the switching timing, that is, the times when the charge switching element 20 is turned on or off, the position in front of the vehicle, from which the reflected light 11 is returned, can be decided according to the timing of the received reflected light 11 by detecting the LD 17 from which the pulsed light is emitted, which LD 17 is included in any of the drive circuits 22 on the channels ch1 to ch16. By measuring the time required until the reflected light is received after the pulsed light 7 is irradiated, the distance between the distance detection device and the entity or obstacle can be calculated. In contrast, if the reflected light 11 is not received, a decision is made that neither a preceding vehicle nor a signboard or the like exists in front of the vehicle.

As mentioned above, in the present embodiment, the LD driving switching element 16 is used in common among the drive circuits 22, and the charge switching elements 20 to be used to accumulate charge in the charge capacitors 14 included in the respective drive circuits 22 are separately disposed.

On the light-emitting board, the LD array 13 and LD driving switching element 16 can be located mutually closely. It is sufficient that only the dispositional relationships among the LD array 13 and charge capacitors 14 be taken into consideration. Therefore, the size of the circuit pattern including the LDs 17 and charge capacitors 14 can be decreased, and the wiring impedances of the loop circuits can be reduced.

Since the size of the circuit pattern can be decreased, a circuit will not be large in scale. Still further, the same number of LD driving switching elements 16 as the number of charge capacitors 14 is not required. Therefore, the cost of the distance detection device can be kept as low as possible.

Second Embodiment

It should be noted that the following description will focus on only difference of the present embodiment from a first embodiment. In the circuit shown in FIG. 4 and presented in accordance with a first embodiment, a charging voltage to be applied for causing the LD 17 to emit light is applied as a reverse voltage to the LDs 17 that are not caused to emit light. In applying a reverse voltage, a leakage current proportional to the voltage is generated. Further, when a higher voltage is applied to the charge capacitor 14 connected to the LD scheduled to emit light so that the LD 17 will emit light of a larger power, the LDs 17 that are not caused to emit light will be destroyed if the voltage exceeds the dielectric strength of the LDs 17 against a reverse voltage.

The charge of the charge capacitor 14 included in the loop circuit scheduled to emit light is restricted by the dielectric strength against a reverse voltage of the LDs 17 included in the loop circuits that are not scheduled to emit light. Therefore, the charge capacitor 14 cannot be fully charged, and a limit is imposed on the intensity of light to be emitted by the LD 17.

The leakage current flows into each of the loop circuits that are not scheduled to emit light, and the charge capacitors 14 included in the loop circuits are charged giving rise to a possibility that the LDs 17 not scheduled to emit light may emit light. In order to prevent such a scenario, a charging time must be shortened so that charging of the chart capacitor 14 included in the loop circuit scheduled to emit light will be completed before the charge capacitors 14 included in the loop circuits not scheduled to emit light are charged with the respective leakage currents.

The present embodiment is characterized in that the foregoing problem is prevented from occurring in the loop circuits.

Figure 6:
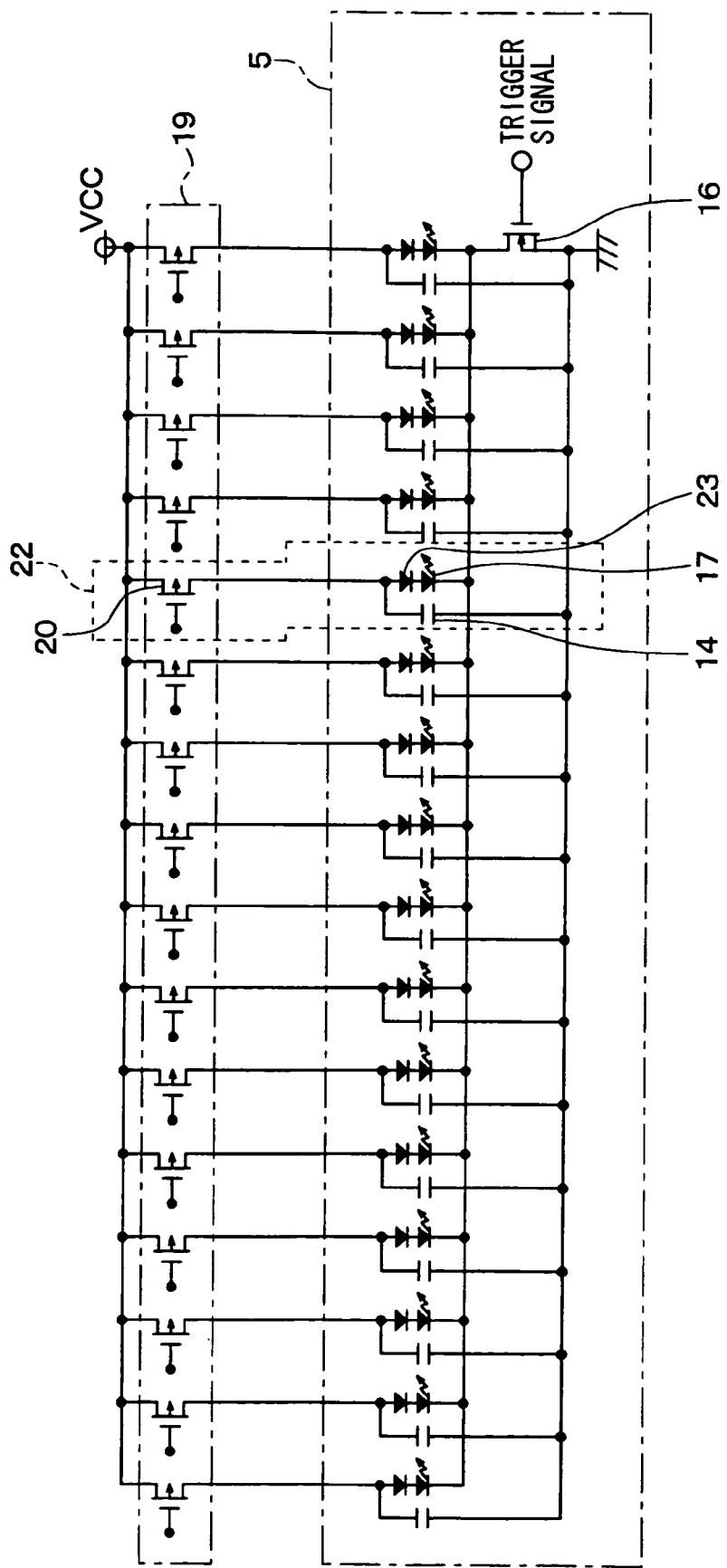
FIG. 6 is a diagram illustrating an equivalent circuit of a light-emitting board and a logic IC employed in a second embodiment.

FIG. 6 shows an equivalent circuit of a light-emitting board 5 and a logic IC 19 included in the present embodiment. In the equivalent circuit shown in the drawing, multiple LDs 17 and the same number of diodes 23 as the number of LDs 17 are included. The LD 17, a charge capacitor 14, a charge switching element 20, and the diode 23 constitute a drive circuit 22.

A loop circuit including the charge capacitor 14, diode 23, and LD 17 is formed in relation to each of the LDs 17. In each of the loop circuits, the circuit elements are interconnected so that when an LD driving switching element 16 is turned on, a current equivalent to charge accumulated in the charge capacitor 14 will flow from the charge capacitor 14 to the LD 17.

Further, the loop circuits are connected onto a common wiring to be electrically interconnected, and are connected to the LD driving switching element 16 over the common wiring.

In each of the loop circuits, the diode 23 is connected between the charge capacitor 14 and LD 17. The diode 23 fills the role of permitting the flow of a current from the charge switching element 20 to the LD 17, and hindering the flow of a current from the LD 17 to the charge switching element 20.

In other words, the diode 23 is connected to the LD 17 in order to block a current that attempts to flow from a loop circuit, different from the loop circuit that includes the diode 23, into the charge capacitor 14 over the common wiring.

In FIG. 6 the diode 23 is connected to the anode of the LD 17. Alternatively, the diode 23 may be connected to the cathode of the LD 17. As long as a current flowing from any other loop circuit does not flow into the charge capacitor 14 over the common wiring over which the loop circuits are interconnected, the diode 23 may be connected to the anode of the LD 17 or the cathode thereof.

Figure 7A:
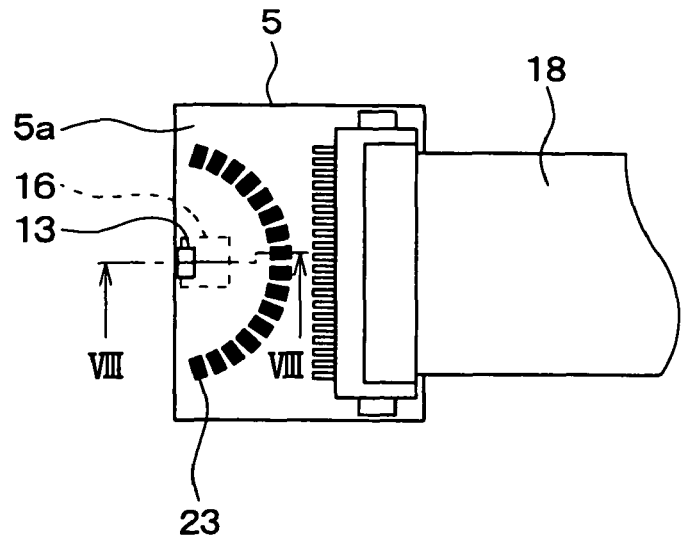
FIG. 7A is a diagram illustrating a plan view of one side of the light-emitting board employed in a second embodiment.
Figure 7B:
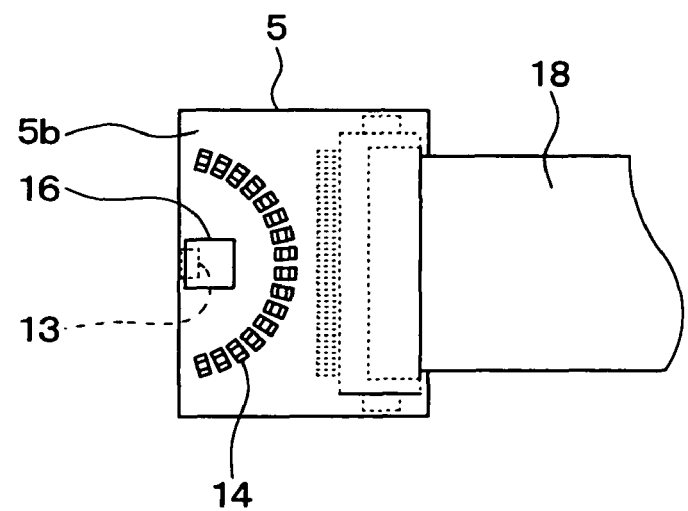
FIG. 7B is a diagram illustrating a plan view of the other side of the light-emitting board.
Figure 8:
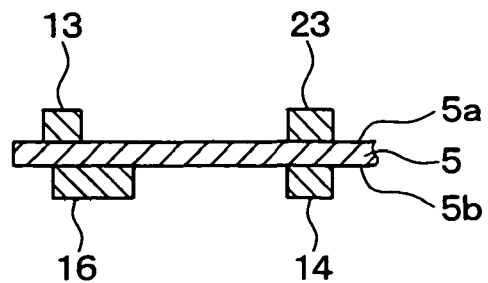
FIG. 8 is a diagram illustrating a B-B sectional view of the light-emitting board shown in FIG. 7A.

FIG. 7A and FIG. 7B are schematic plan views of the light-emitting board 5. FIG. 7A is the plan view of one side 5a of the light-emitting board 5, and FIG. 7B is the plan view of the other side 5b of the light-emitting board 5. FIG. 8 is the B-B sectional view of the light-emitting board shown in FIG. 7A. Incidentally, the wirings linking circuit elements are not shown in FIG. 7A and FIG. 7B and FIG. 8.

As shown in FIG. 7A, the LD array 13 and diodes 23 are disposed on one side 5a of the light-emitting board 5. As shown in FIG. 7B, the LD driving switching element 16 and charge capacitors 14 are disposed on the other side 5b of the light-emitting board 5.

The LD array 13 including the multiple LDs 17, the multiple charge capacitors 14, the multiple diodes 23, and the LD driving switching element 16 are disposed on the light-emitting board 5 so that the lengths of the wirings included in the loop circuits will be squared with one another. Since the wiring impedances each of which includes a parasitic resistance and a parasitic inductance produced in each of the loop circuits will be squared with one another, the LDs 17 emit light of the same intensity.

Similarly to a first embodiment, the LD array 13 disposed on the one side 5a of the light-emitting board 5, and the LD driving switching element 16 disposed on the other side 5b of the light-emitting board overlap in a direction perpendicular to the one side 5a of the light-emitting board 5. Since the LD array 13 and LD driving switching element 16 are located mutually closely, the wiring impedances are reduced.

In the present embodiment, as shown in FIG. 7A, the diodes 23 are disposed on the one side 5a of the light-emitting board 5. More particularly, the diodes 23 are disposed on the one side 5a of the light-emitting board 5 in arcuate relation having a center at an intermediate point interposed between the center point of the LD array 13 and the center point of the LD driving switching element 16. The LD array 13 and diodes 23 can be laid out while being interconnected by the shortest wiring length.

As shown in FIG. 7B, the charge capacitors 14 are disposed on the other side 5b of the light-emitting board 5. More particularly, the charge capacitors 14 are disposed on the other side 5b of the light-emitting board 5 in arcuate relation having a center at an intermediate point interposed between the center point of the LD array 13 and the center point of the LD driving switching element 16, as a center. The LD driving switching element 16 and charge capacitors 14 can therefore be laid out while being interconnected by the shortest wiring length.

Because of the arc-shaped disposition of the diodes 23 or charge capacitors 14, a parasitic resistance and a parasitic inductance produced in each of the loop circuits are reduced, and light of a large power and a short pulse width can be emitted.

Further, as shown in FIG. 8, the diodes 23 are located on the side of the light-emitting board 5 opposite to the side thereof on which the charge capacitors 14 are located. In other words, the light-emitting board 5 is sandwiched between the diodes 23 and charge capacitors 14. As a result, the length of the wiring of the loop circuit including each of the LDs 17 of the LD array 13, each of diodes 23, each of the charge capacitors 14, and the LD driving switching element 16 can be decreased. The element area of the diodes 23 can be increased in order to reduce the resistance caused by the diodes 23. Even if the element area of the diodes 23 is increased, the disposition of the charge capacitors 14 will not be adversely affected.

Figure 9:
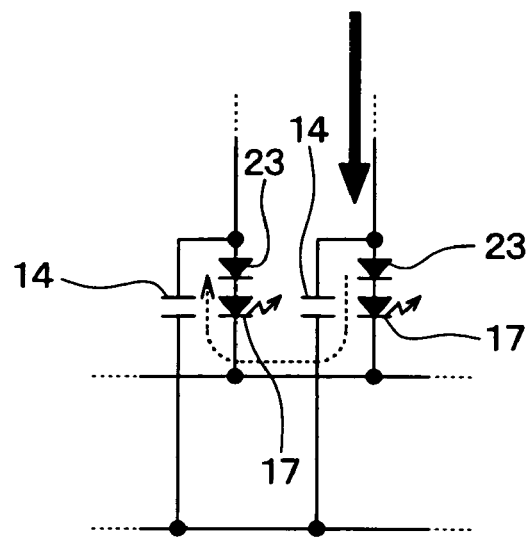
FIG. 9 is a diagram illustrating a circuit diagram for use in explaining the operation of a diode for blocking a leakage current in a second embodiment.
Figure 10:
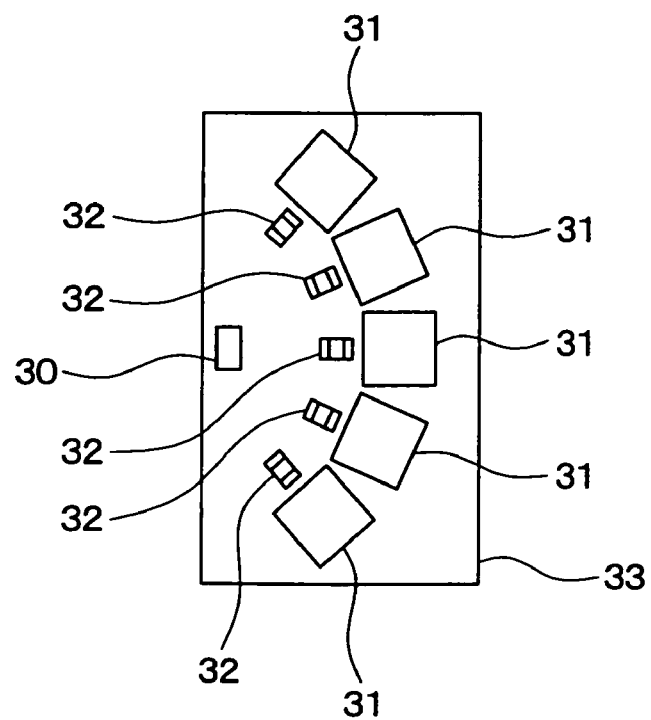
FIG. 10 is a diagram illustrating a problem that can be solved in accordance with various embodiments.

Next, an operation of blocking a leakage current that flows from any other loop circuit, by utilizing the addition of the diode 23 to each of the loop circuits will be described with reference to the drawing. FIG. 9 is a circuit diagram showing a loop circuit that includes the LD 17 scheduled to emit light and a loop circuit that is not scheduled to emit light.

As described in relation to a first embodiment, the charge capacitor 14 included in the loop circuit including the LD 17 scheduled to emit light is charged in order to allow the LD 17 to emit light. A current indicated with a solid-line arrow in FIG. 9 flows into the loop circuit, and the charge capacitor 14 is charged.

While the charge capacitor 14 is being charged, since the loop circuits are electrically interconnected over the common wiring, a reverse voltage is applied to the LD 17 that is not scheduled to emit light, and a leakage current is generated in the loop circuit shown in the drawing and in the other loop circuits that are not shown in the drawing.

Even in the foregoing situation, since the diode 23 is included in the loop circuit including the LD 17 not scheduled to emit light, the diode 23 blocks the leakage current that attempts to flow from the LD 17 to the charge capacitor 14. The charge capacitor 14 associated with the LD 17 not scheduled to emit light is therefore not charged with the leakage current caused by the voltage applied to the loop circuit including the LD 17 scheduled to emit light. Accordingly, the LD 17 not scheduled to emit light is prevented from emitting light.

Since the diode 23 receives a majority of a reverse voltage, a reverse voltage to be applied to the LD 17 is alleviated. Therefore, a voltage exceeding the dielectric strength against a reverse voltage of the LD 17 scheduled to emit light can be applied to the LD 17. The restrictions on an amount of charge to be accumulated in the charge capacitor 14 can be greatly loosened, and the limit of the intensity of light to be emitted from the LD 17 can be raised. Further, shortening the charging time of the charge capacitor 14 need not be performed as a countermeasure against occurrence of a leakage current.

As for the relationship of correspondence between the description of the present embodiment and the description of claims, the diodes 23 can correspond to claimed backflow prevention elements.

Other Embodiments

It should be noted that the internal structure of the distance detection device shown in FIG. 1 and FIG. 2 is a mere example and other structures are possible. The distance detection device presented in the embodiments is a mere example to which a laser array circuit is adapted. The laser array circuit may be applied to any usages other than the distance detection device.

In a first embodiment, the LD array 13 and charge capacitors 14 are disposed on the one side 5a of the light-emitting board 5, and the LD driving switching element 16 is disposed on the other side 5b of the light-emitting board 5. The dispositional relationships are mere examples and other disposing methods may be adopted.

The charge capacitors 14 may be disposed in the form of an arc having a center the intermediate point interposed between the center point of the LD array 13 and the center point of the LD driving switching element 16. The length of the wiring laid among the LD 17, LD driving switching element 16, and charge capacitor 14 can be minimized.

In the above described embodiments, the LD driving switching element 16 is used in common among all the LDs 17. Multiple units each having the LD driving switching element 16 used in common among multiple LDs 17 may be included. In such a case, the multiple LD driving switching elements 16 to be used in common are disposed on the other side 5b of the light-emitting board 5.

In the above described embodiments, the dispositional relationship of the LD array 13 and LD driving switching element 16 is overlapping in a direction perpendicular to the one side 5a of the light-emitting board 5. However, such a dispositional relationship is an example. The LD array 13 and LD driving switching element 16 may be disposed so as not to overlap.

In the above described embodiments, the charge capacitors 14 are disposed in arcuate relation having a center at an intermediate point interposed between the center point of the LD array 13 and the center point of the LD driving switching element 16. Such a disposition is a mere example. The disposition of the charge capacitors 14 may take another shape other than an arc shape.

In the above described embodiments, MOSFETs are adopted as the charge switching elements 20 and LD driving switching element 16. However, the present invention is not limited to the MOSFETs. Other transistors may be adopted.

In the above described embodiments, the charge switching elements 20 are incorporated in the logic IC 19, and the microcomputer 21 controls the charge capacitors 14. The multiple charge switching elements 20 may be incorporated in a sequencer that includes the logic IC 19 which realizes one facility. A driver IC may be substituted for the sequencer. Any other control means may be used for control.

In the above described embodiments, the LD array 13 and multiple charge capacitors 14 are disposed on the light-emitting board 5 so that the lengths of the wirings that link the respective LDs 17 included in the LD array 13 and the respective charge capacitors 14 associated with the LDs 17 will be made to be equal with one another so as to cause the wiring impedances to be equal with one another. If equal wiring impedances need not be taken into consideration, the lengths of the wirings need not be made equal with one another.

In the above described embodiments, the charge switching elements 20 are adopted having features such as a lower switching speed, a smaller current capacity, a larger on-resistance, and a smaller size than the LD driving switching element 16. The charge switching elements need not have all the features but may have some of the features and may also exhibit other parameters.

In a second embodiment, the LD array 13 and diodes 23 are disposed on the one side 5a of the light-emitting board 5, and the LD driving switching element 16 and charge capacitors 14 are disposed on the other side 5b of the light-emitting board 5. Such dispositions are mere examples, and other dispositions are possible. For example, the diodes 23 and charge capacitors 14 may be disposed on the one side 5a of the light-emitting board 5. Even in such a case, the diodes 23 and charge capacitors 14 can be disposed in arcuate relation.

In a second embodiment, the diode 23 has been described as an example of a backflow prevention element. Alternatively, a laser diode may be adopted at the backflow prevention element. Since the dielectric strength of one laser diode is generally low, multiple laser diodes interconnected in multiple layers may be adopted as the backflow prevention element. In such a case, when the LD 17 emits light, since the multiple laser diodes serving as the backflow prevention element emit light, the advantage is provided that an amount of light to be emitted from the loop circuit can be increased.

What is claimed is:

1. A laser array circuit comprising:
a drive circuit including:
a laser diode array including a plurality of laser diodes that emit light;
a plurality of charge capacitors in which charge is accumulated; and
a plurality of charge switching elements that cause the charge to accumulate in the plurality of charge capacitors;
a laser diode driving switching element causing a current equivalent to the charge accumulated in one of the plurality of the charge capacitors to flow into a one of the plurality of the laser diodes scheduled to emit light so as to generate a pulsed light; and
a tabular light-emitting board having a first side and a second side, wherein:
the plurality of laser diodes, the plurality of charge capacitors, and the plurality of charge switching elements have a corresponding number of members;
the laser diode driving switching element is used in common among the plurality of laser diodes;
charge is sequentially accumulated in the one of the plurality of the charge capacitors associated with the one of the plurality of laser diodes scheduled to emit light, and the laser diode driving switching element is repeatedly turned on and off in order to cause additional ones of the plurality of laser diodes, among which the laser diode driving switching element is used in common, to emit light;
the laser diode array and the plurality of charge capacitors are disposed on the light-emitting board such that wiring lengths linking the respective laser diodes included in the laser diode array and the plurality of charge capacitors associated with the plurality of laser diodes are equal;
the laser diode array and the plurality of charge capacitors are disposed on the first side of the light-emitting board, and the laser diode driving switching element is disposed on the second side of the light-emitting board; and
the laser diode array and the laser diode driving switching element overlap in a direction perpendicular to the first side of the light-emitting board.

2. The laser array circuit according to claim 1, further comprising a plurality of units each including the drive unit and the laser diode driving switching element used in common among the plurality of laser diodes are included.

3. The laser array circuit according to claim 1, further comprising a means that manages whether charge is accumulated in the charge capacitor based on the time during which the charge switching element remains on.

4. The laser array circuit according to claim 1, wherein the plurality of charge capacitors are disposed in arcuate relation having a center at an intermediate point interposed between a center point of the laser diode array and a center point of the laser diode driving switching element.

5. A laser array circuit comprising:
a drive circuit including:
a laser diode array including a plurality of laser diodes that emit light;
a plurality of charge capacitors in which charge is accumulated; and
a plurality of charge switching elements that cause the charge to accumulate in the plurality of charge capacitors; and
a laser diode driving switching element causing a current equivalent to the charge accumulated in one of the plurality of the charge capacitors to flow into a one of the plurality of the laser diodes scheduled to emit light so as to generate a pulsed light, wherein:
the plurality of laser diodes, the plurality of charge capacitors, and the plurality of charge switching elements have a corresponding number of members;
the laser diode driving switching element is used in common among the plurality of laser diodes;
charge is sequentially accumulated in the one of the plurality of the charge capacitors associated with the one of the plurality of laser diode scheduled to emit light, and the laser diode driving switching element is repeatedly turned on and off in order to cause additional ones of the plurality of laser diodes, among which the laser diode driving switching element is used in common, to emit light;

the drive circuit further comprises a same number of backflow prevention elements as the number of the plurality of the laser diodes forming a plurality of backflow prevention elements, wherein:

a loop circuit including the one of the plurality of charge capacitors, one of the plurality of backflow prevention elements, and the one of the plurality of laser diodes is formed in relation to each of the plurality of laser diodes so that a current equivalent to the charge accumulated in the charge capacitor will flow from the one of the plurality of charge capacitors to the one of the plurality of laser diodes to form a plurality of loop circuits;

each of the plurality of the loop circuits is connected to a common wiring and to the laser diode driving switching element over the common wiring; and the backflow prevention element is connected to the one of the plurality of laser diodes in order to block a current that attempts to flow from a loop circuit different from the loop circuit including the backflow prevention element, into the charge capacitor over the common wiring.

6. The laser array circuit according to claim 5, further comprising a tabular light-emitting board, wherein:

the laser diode array including the plurality of laser diodes, the plurality of charge capacitors, the plurality of backflow prevention elements, and the laser diode driving switching element are disposed on the light-emitting board so that the lengths of the wirings of the respective loop circuits are equal with one another.

7. The laser array circuit according to claim 6, wherein:

the light-emitting board has a first side and a second side;

the laser diode array is disposed on the first side of the light-emitting board, and the laser diode driving switching element is disposed on the second side of the light-emitting board; and the laser diode array and laser diode driving switching element overlap in a direction perpendicular to the first side of the light-emitting board.

8. The laser array circuit according to claim 6, wherein:

the plurality of charge capacitors are disposed on the second side of the light-emitting board in arcuate relation having a center at an intermediate point interposed between a center point of the laser diode array and a center point of the laser diode driving switching element; and the plurality of backflow prevention elements are disposed on the first side of the light-emitting board in arcuate relation having a center at an intermediate point interposed between a center point of the laser diode array and a center point of the laser diode driving switching element.

9. The laser array circuit according to claim 6, wherein the plurality of backflow prevention elements are located on the first side of the light-emitting board opposite to the second side on which the charge capacitors are located.

10. The laser array circuit according to claim 5, wherein the plurality of backflow prevention elements includes a plurality of diodes.

11. The laser array circuit according to claim 5, wherein the plurality of backflow prevention elements includes a plurality of laser diodes.

12. The laser array circuit according to claim 11, wherein the plurality of laser diodes are interconnected in multiple layers.

13. The laser array circuit according to claim 1, wherein the plurality of charge switching elements and the laser diode driving switching element include a plurality of MOSFETs.

14. The laser array circuit according to claim 1, wherein the plurality of charge switching elements include a lower switching speed, a smaller current capacitor, a larger on resistance, and a smaller size than the plurality of laser diode driving switching elements.

15. The laser array circuit according to claim 1, wherein the plurality of charge switching elements are incorporated in a logic IC that forms one driver facility.

16. The laser array circuit according to claim 1, wherein the plurality of charge switching elements are incorporated in a sequencer including a plurality of logic ICs each of which forms one driver facility.

17. The laser array circuit according to claim 5, wherein the plurality of charge switching elements and the laser diode driving switching element include a plurality of MOSFETs.

18. The laser array circuit according to claim 5, wherein the plurality of charge switching elements include a lower switching speed, a smaller current capacitor, a larger on resistance, and a smaller size than the plurality of laser diode driving switching elements.

19. The laser array circuit according to claim 5, wherein the plurality of charge switching elements are incorporated in a logic IC that forms one driver facility.

20. The laser array circuit according to claim 5, wherein the plurality of charge switching elements are incorporated in a sequencer including a plurality of logic ICs each of which forms one driver facility.

* * * * *